(12) United States Patent
Sekihara

(10) Patent No.: US 8,449,966 B2
(45) Date of Patent: May 28, 2013

(54) PELLICLE FRAME AND A PELLICLE

(75) Inventor: Kazutoshi Sekihara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 132 days.

(21) Appl. No.: 13/137,836

(22) Filed: Sep. 16, 2011

(65) Prior Publication Data

US 2012/0107548 A1    May 3, 2012

(30) Foreign Application Priority Data

Oct. 28, 2010    (JP) .................. 2010-241603

(51) Int. Cl.
*B32B 1/00*    (2006.01)

(52) U.S. Cl.
USPC .................... 428/76; 430/5; 428/14

(58) Field of Classification Search
USPC .......................... 428/76, 14; 430/5
See application file for complete search history.

(56) References Cited

FOREIGN PATENT DOCUMENTS

JP    2006-056544    3/2006
JP    2006-284927    10/2006

*Primary Examiner* — Alexander Thomas
(74) *Attorney, Agent, or Firm* — Manabu Kanesaka

(57) ABSTRACT

A new kind of pellicle frame is proposed which is made up of a core body and a clad body; the core body consists of a composite of carbon fiber plus resin, and it is preferred that the carbon fiber exists in the form of a laminated body of carbon fiber sheets in which the resin is impregnated; and the clad body is the outer layer sealing the core body such that no carbon is exposed through the clad body.

7 Claims, 2 Drawing Sheets

PELLICLE FRAME AND A PELLICLE

PRIORITY CLAIMED

The present non-provisional application claims priority, as per Paris Convention, from Japanese Application No. 2010-241603 filed on Oct. 28, 2010, the disclosure of which is hereby incorporated by reference herein in its entirety.

TECHNICAL FIELD

The present invention relates to a pellicle useful as a dust-fender employed in the scenes of manufacturing semiconductor devices, printed circuit boards and liquid crystal display panels.

BACKGROUND TECHNOLOGY

In manufacturing semiconductor devices such as LSI and super-LSI or in manufacturing a liquid crystal display panel or the like, a pattern is made by irradiating light to a semiconductor wafer or an exposure original plate for liquid crystal, but if a dust adheres to a photomask or a reticle used in this stage (herein collectively called "photomask"), the dust absorbs light or refracts it, causing deformation of a transferred pattern, roughened edges or black stains on a base, and leads to a problem of damaged dimensions, poor quality, deformed appearance and the like.

Thus, these works are usually performed in a clean room, but, even in a clean room, it is still difficult to keep the photomask clean all the time. Therefore, the light irradiation is conducted only after a surface of the photomask is sheltered by a pellicle. Under such circumstances, foreign particles do not directly adhere to the surface of the photomask, but only onto the pellicle membrane, which is sufficiently remote from the surface of the photomask, and thus by setting a photo focus on a lithography pattern on the photomask, the foreign particles on the pellicle membrane fail to transfer their shadows on the photomask and thus no longer become a problem to the image transfer performance.

In general, a pellicle is built up of a pellicle frame, which is an endless frame bar usually made of aluminum, a stainless steel, or polyethylene, and a transparent pellicle membrane usually made of cellulose nitrate, cellulose acetate or a fluorine-containing polymer which transmit light well; this membrane is attached via dried solution or adhesive to one of the two annular faces (hereinafter referred to as "upper annular face"); furthermore, on the other one of the two annular faces of the frame (hereinafter referred to as "lower annular face") is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer. FIGS. 1 and 2 show a construction of a general type pellicle.

In general, a pellicle membrane is a thin film made of a resin, so that in order to fix it on a pellicle frame in a slack-free manner, it is necessary to stretch the pellicle membrane to an appropriate extent as it is being fixed on the frame. Therefore, in general, in the case of a rectangular pellicle, which is generally used, the pellicle frame after being coupled with the pellicle membrane tends to curve inwardly to some extent.

This phenomenon is more conspicuous in the case of a large-sized pellicle, used for manufacturing printed circuit boards and liquid crystal display panels, for example, wherein the frame bars are relatively long, and also in the case of a small-sized pellicle, used for manufacturing semiconductor devices, wherein the frame is made of a material having low rigidity as is required for the reasons of limitations in material kind and size.

On the other hand, the photomask is required to provide as large an area as possible to be exposed to light for the reason of low cost. On account of this, the inward sagging of the frame bars is a problem as it decreases the area of the photomask available for light exposure. Also, in the case of a pellicle wherein the contour of the pellicle frame as seen from above is too deformed from rectangle, that is, if the external sides of the frame are not straight enough, it gives rise to a problem of lowered precision in mounting the pellicle in the predetermined site on the photomask.

It is not only the inward direction of the pellicle frame, in which the tension of the pellicle membrane is oriented, that the sagging of the pellicle frame bars becomes a problem; but also in the direction of the thickness (or height) of the pellicle frame, in which direction the pellicle frame bars can sag during pellicle manufacturing or during a handling step prior to pasting of the pellicle membrane, if the thickness (height) of the frame bars is small in comparison to the lengths of the frame bars. Especially in the case of an extra large pellicle frame wherein the frame bars exceed 1000 mm in length, the frame bars would sag downwardly conspicuously in the middle when the pellicle frame is held horizontally by being supported at the four corners for transportation, and this would considerably thwart a smooth handling and in some cases would result in a permanent deformation of the frame.

In the past, Publication-in-IP 1 proposed a means for solving the sagging problem of the pellicle frame, according to which one parallel pair of the frame bars are formed in a manner such that the middle part of respective bar is convexed outwardly in a shape of an arc, which part is adjoined on either end by a concave part in a shape of an arc, which in turn is adjoined by straight part. However, although this means is useful in preventing an inward sagging of the pellicle frame caused by the pellicle membrane tension, it is not useful in solving the problem of sagging in the thickness-wise direction of the pellicle frame, for it does not increase the rigidity of the pellicle frame.

An answer to solving this problem is increasing the rigidity of the pellicle frame, and there are two ways of doing this, namely, increasing the cross sectional area of the pellicle frame bar and selecting for the pellicle frame a material which is high in elasticity modulus.

The method of enlarging the cross sectional area of the pellicle frame bar, that is, the dimensional expansion, is not appropriate in that an inward expansion would narrow the exposure area of the photomask and in that an outward expansion would make it difficult to secure a sufficient amount of clearance for the fixation of the photomask and for handling at the time of transportation. Furthermore, in the thickness-wise (height-wise) direction, there is a restriction imposed by the light exposure apparatus that the height of the frame bar must be from 3 to 8 mm or so. Therefore, there is virtually little freedom for the dimensional designing and thus it is difficult to resort to a dimensional change to increase the rigidity.

On the other hand, as the way for increasing the rigidity of the pellicle frame by using a material having a higher elasticity modulus, there are proposed alternatives such as steel, stainless steel, titanium alloy, and aluminum alloy reinforced with a built-in substance having a higher rigidity, to replace the conventional aluminum alloy (Publication-in-IP 2). However, iron-based alloys such as steel and stainless steel are too weighty, and titanium alloy is very difficult to grind into shapes so that they are scarcely used in practice. As an alternative to these, carbon fiber reinforced plastic (CFRP), which is increasingly used in the aircraft industry and is known as a high rigidity material, is expected to extensively improve the rigidity of the pellicle frame, more than the above-mentioned materials, and that without being too weighty and too difficult to grind in shapes. However, it has been greatly feared that by using carbon fiber the possibility of creating foreign particles would be high, and hence this has not been adopted.

LIST OF PRIOR ART PUBLICATIONS

Publications-in-IP

[Publication-in-IP 1] Japanese Patent Application Publication 2006-56544

[Publication-in-IP 2] Japanese Patent Application Publication 2006-284927

BRIEF DESCRIPTION OF THE INVENTION

Problems the Invention Seeks to Solve

The present invention was made in view of the problems described above, and hence it is an object of the invention to propose a pellicle frame having such a high rigidity that it undergoes only insubstantial degree of sagging in response to the tension imposed by the pellicle membrane and that it resists the external forces so much so that it remains virtually free of deformation when the pellicle is handled in a production line, and the invention also proposes a pellicle complete with such a pellicle frame.

The pellicle frame according to the present invention is characterized in that, after a frame is formed by machining a composite preformed material composed of elements of carbon fiber and resin, the frame is coated with a resin layer all over its surface in such a manner that the carbon fiber is not exposed from the frame surface. The material to make the resin layer is preferably selected from a fluorine-containing resin, a silicone resin and an acrylic resin, and its color is preferably black.

The pellicle according to the present invention is characterized in that it is made with such a pellicle frame.

According to the present invention, the pellicle frame is enabled to have such a high rigidity that the inner sagging of the frame bars due to the tensile strength of the pellicle membrane and the deformation and bows that occur during handling of the pellicle frame are decreased, and thus the manufacturing and mounting-on-photomask operations become easier and the reduction in exposure area due to the frame sagging is minimized. Furthermore, since it is possible to design the pellicle frame to have narrower frame bars compared to the conventional design, the exposure area can be expanded. On top of this, since the inventive pellicle frame is overlaid with a resin coating, the carbon fiber does not come to surface and hence does not create dust or get degraded by ultraviolet rays; and the result is a dependable and durable pellicle.

EMBODIMENTS TO PRACTICE THE INVENTION

The pellicle frame of the present invention is made of a composite material composed of elements of carbon fiber and resin, and is coated with a resin layer all over its surface, the coating being carried out after the frame is shaped, so that the carbon fiber is not exposed from the frame surface and thus it does not become a cause for dust creation and the frame rigidity is rendered extremely high. The resin layer may preferably be made of a fluorine-containing resin, but it is possible to use a silicone resin or an acrylic resin in place thereof. These materials are recommended on account of their good light stability, low gas emission, and good coatability.

Furthermore, it is preferable that the resin layer is black in color, for by being black the resin layer restricts irregular reflection from the sub-surface of the frame, and also it can hide defects underneath, so that the inspection for foreign matter on the frame surface becomes more simplified.

By constructing a pellicle using the pellicle frame of the present invention, it is possible to obtain an excellently reliable pellicle, which has such a high frame rigidity that the frame bars do not virtually sag inwardly in spite of the membrane tension and scarcely sag in any direction during its handling, and furthermore the frame does not produce dust or degrades during its use. Such function and effect of the invention are more conspicuous in the case of a large-sized pellicle used for manufacturing of liquid crystal display panels and having frame bars of lengths exceeding 1000 mm.

Incidentally, the present invention is not limited to any size ranges of the pellicle, but can be applied to all kinds of pellicle which are difficult to secure a sufficient frame rigidity comparable to the size (frame bar lengths) or to the tension of the pellicle frame, for the reason of its dimension.

The invention shall be explained in more details with reference to the drawings.

Figure 1:
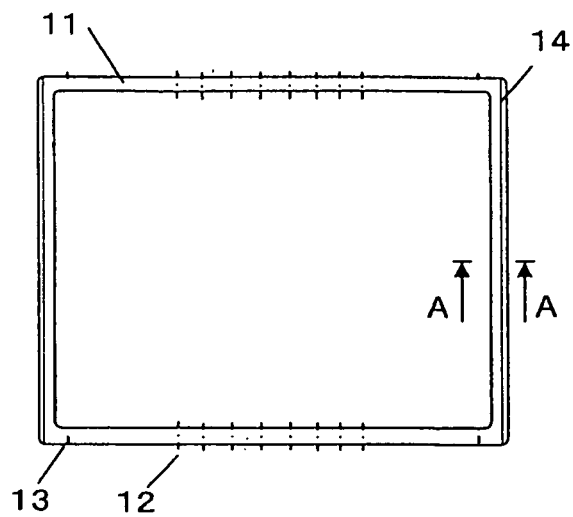
FIG. 1 is a plan view showing an example of a pellicle frame of the present invention.
Figure 2:
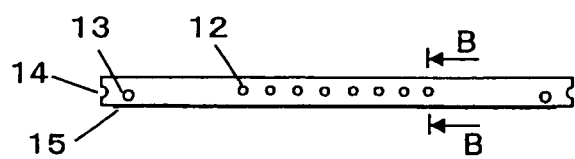
FIG. 2 is a front view of the pellicle frame shown in FIG. 1.
Figure 3:
FIG. 3 is a right side view of the pellicle frame shown in FIG. 1.
Figure 4:
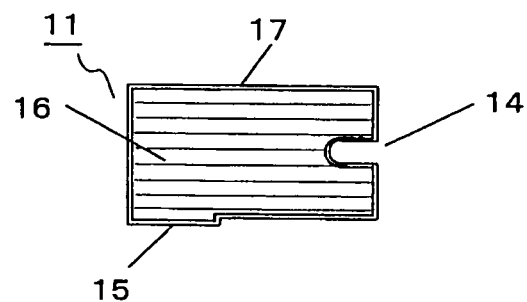
FIG. 4 is a cross-sectional view taken along the line A-A of FIG. 1.
Figure 5:
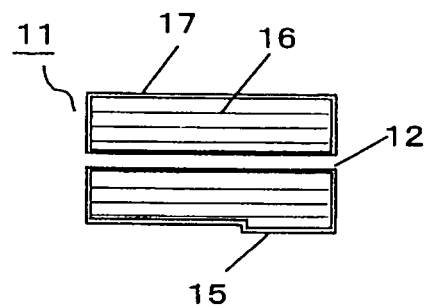
FIG. 5 is a cross-sectional view taken along the line B-B of FIG. 2.

The pellicle frame according to the invention is shown schematically in FIGS. 1 through 3. FIG. 1 is a plan view of the pellicle frame; FIG. 2 is a front view thereof; and FIG. 3 is a right side view thereof. FIG. 4 is a cross-sectional view of the pellicle frame taken along the line A-A of FIG. 1; and FIG. 5 is a cross-sectional view of the pellicle frame taken along the line B-B of FIG. 2. Incidentally, the pellicle frame in this example is rectangular in its contour, but the invention includes pellicle frames of shapes like square, octagon, and circle The pellicle frame 11 is provided with vent holes that penetrate the frame bar in the width-wise direction thereof, and pit holes 13 and grooves 14 for facilitating the handling of the pellicle frame. The four corners of the pellicle frame are rounded inside as well as outside. The lower annular face of the pellicle frame where the agglutinant layer is laid is formed with a step 15 to help form the agglutinant layer, but it is not necessary to provide such a step. Depending on requirements from the customers, it is possible to provide the pellicle frame 11 with a chamfering, other kinds of steps, or other kinds of pit holes and grooves.

The pellicle frame 11 is composed of a carbon fiber composite, which is made in the following manner: a number of carbon reinforcing fiber sheets impregnated with a curable liquid resin, i.e., prepregs 16, are laminated and then cured thermally. The most preferable way of making a pellicle frame is to laminate a number of prepregs of continuous and monolithic carbon fiber sheets and to cure the prepregs to form a plate of carbon fiber composite, and then to cut it to a predetermined shape to obtain a continuous frame; however, on account of the difficulty in obtaining such a carbon fiber sheet in sufficiently large sizes and on account of the need for cost reduction, one must report to other methods, and in this regard, for example, it is possible to make the frame bars separately and then connect them together with adhesive to obtain a frame.

As for the carbon fiber sheet 16, it is possible to employ one of a unidirectional continuous fiber-reinforced composite or an orthogonally woven fiber-reinforced composite. Also, it is possible to design the elastic modulus for the carbon fiber arbitrarily. The tensile strength of the carbon fiber should be 1-6 GPa, and more preferably, 2-5 GPa. The tensile modulus of the carbon fiber should be 200-1000 GPa, and more preferably, 300-900 GPa.

A preferable resin with which the carbon fiber sheet is impregnated may be an epoxy resin, but it is possible to use a phenol resin, a polyamide resin, or the like. Among such resins, it is recommended to use one which has a relatively high cure temperature and high heat resistance, for in the later process wherein the frame surface is coated with a resin coat, it is possible to adopt a higher heating temperature, whereby the resulting frame would show low gas emission. The content of the resin in the carbon fiber sheet is normally 10-40 mass %, and preferably it is 20-30 mass %.

The laminate body of the carbon fiber sheets 16 as prepared in the above-mentioned manner is heated in an autoclave, and after the complete hardening of the resin the body is machined into a predetermined shape of the pellicle frame 11 by an equipment such as machining center; then the pellicle frame is finished by being tooled to have vent holes 12, pit holes 13 for handling, and a groove 14. In this final step, especially in making the holes such as the vent holes 12 and the pit holes 13, a special care must be taken so as to avoid dissociation of the carbon fiber sheets.

After this machining and final tooling, the surfaces of the pellicle frame contain exposed broken carbon fibers, which are not entirely removed even by washing, so that during the use of the pellicle they are liable to cause generation of dust of fibers and resin particle. Furthermore, the resin such as epoxy resin that constitutes the carbon fiber composite tends to degrade when exposed to ultraviolet rays that are used in light exposure step of lithography, so that the degraded resin would weaken the frame strength and be likely to add to the dust generation.

Therefore, a resin coat 17 is laid over the surfaces of the machined and tooled pellicle frame, to cover up the entire body of the frame so as to prevent the carbon fiber composite from surfacing. It is of course preferable that the material of the resin coat 17 is something that is hard to degrade against the ultraviolet rays used in light exposure step and the ozone generated then. The color of the resin coat 17 is preferably a dark one (such as dark blue) or a transparent one, since the color of the carbon fiber composite forming the sub-surface is black; it is especially preferred that the resin coat 17 is black for, thus, light scattering is reduced. It is possible to use a resin that has its inherent color or use a resin which is colored with a pigment or carbon black or the like.

Among the resins that satisfy some of these attributes, fluorine-containing resin, silicone resin, and acrylic resin are especially preferred. If these particular resins are used, which are highly resistive to ultraviolet light and thus do not easily degrade, it is possible to effectively protect the underlying carbon fiber composite also.

The thickness of the resin coat is normally 5-80 micrometers, preferably 10-50 micrometers, and more preferably 20-40 micrometers.

The method for forming the resin coat 17 over the pellicle frame 11 is as follows: the pellicle frame fabricated of the carbon fiber composite is carefully washed and dried; then a resin, which may be the same resin as the one used in the carbon fiber composite, is dissolved in a solvent to an appropriate concentration; an additive such as carbon black, depending on the requirement, is dispersed in the solution; and this liquid is applied to the pellicle frame by means of any of the publicly known coating method such as spraying, dipping, and electro deposition coating, the selection being dependent on the kind of the resin used. After the formation of the resin coat, the whole body of the pellicle frame is subjected to heat-treatment so as to cause the solvent to entirely evaporate and to expel the low molecular weight substances from the resin coat as much as possible. The higher the temperature for the heat-treatment is, the better; but the temperature is determined in consideration of total factors including the softening temperatures of the carbon fiber composite and the resin coat and the boiling point of the solvent used for the coating of the resin coat.

Other factors are relevant in the formation of the resin coat, such as gloss level of the resin coat surface. It is possible to reduce the phenomenon of stray light in the light exposure machine and to simplify the foreign matter inspection in the dark room if the gloss level of the coat surface is 3 or lower when measured by a conventional gloss meter. It is noted that the value measured by the gloss meter is a proportional value assuming a glass surface is 100 in gloss level (JIS Z8741).

Figure 6:
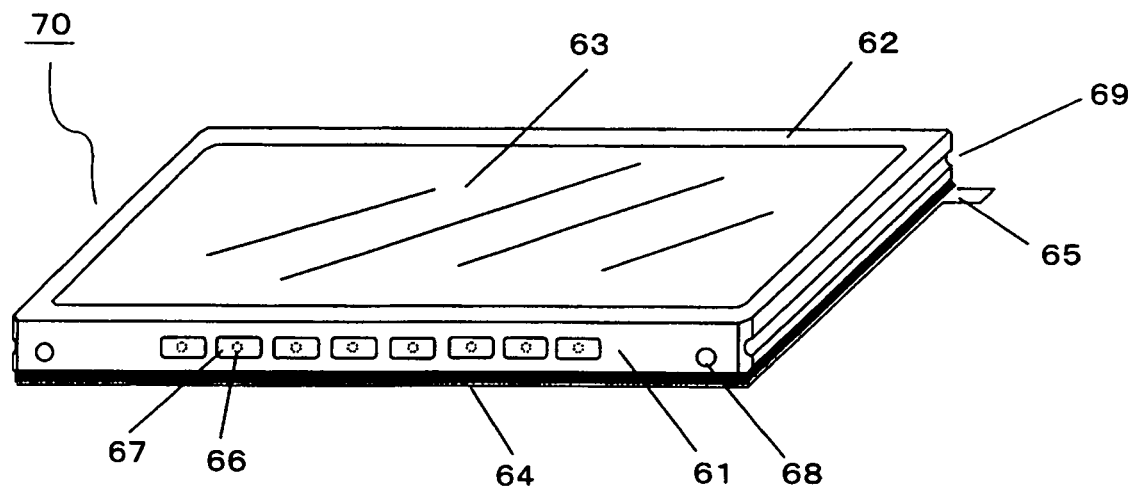
FIG. 6 is a perspective view showing schematically a pellicle of the present invention.

A pellicle 70 fabricated using the pellicle frame made in the manner as described above is schematically shown in the perspective view of FIG. 6. On the upper annular face of the pellicle frame 61 made of the carbon fiber composite covered with the resin coat is bonded a stretched pellicle membrane 63 via pellicle membrane-bonding adhesive layer 62. The pellicle membrane 63 may be made of cellulose, cellulose acetate, cellulose propionate or a fluorine-containing resin. On the lower annular face is provided a photomask-bonding agglutinant layer 64. The photomask-bonding agglutinant layer 64 may be composed of an acrylic agglutinant, a rubber-based agglutinant, hot melt agglutinant, or a silicone agglutinant. Over this photomask-bonding agglutinant layer 64 may be laid a releasable layer (separator) 65 consisting of a lamination of a releasing agent layer and a thin resin film such as PET for protecting the agglutinant layer, if so required.

Also, depending on the needs, it is fine to make a vent hole 66, which penetrates a frame bar of the pellicle frame 61 in a direction parallel to the annular faces of the frame, so as to prevent the pellicle membrane from inflating or deflating as the pressure difference occurs across the frame bar, and it is also fine to cover up the vent hole 66 with a filter 67 so as to prevent foreign particles from being carried by the ventilation into the inner space of the pellicle. Furthermore, it is fine to provide pit holes 68 and grooves 69 for accommodating easier handling.

EMBODIMENT OF THE INVENTION

We will now explain in detail the present invention with reference to Examples 1 through 3 and Comparative Examples 1 through 3, but the invention shall not be limited to such examples and can take other forms than they do.

Example 1

As a preform for making a pellicle frame, TORAYCA P13055F-13a (a product name, manufactured by Toray Industries, Inc.) was used. It is a carbon fiber sheet (prepreg) which is made by impregnating a carbon fiber structure with epoxy resin and which has a tensile strength of 588 GPa. This sheet was laminated one upon another and then thermally cured to form a plate of a carbon fiber composite measuring 1550 mm×1750 mm×6.5 mm.

This preform plate was machined with a machining center into a shape as shown in FIGS. 1 through 5, and thus a rectangular pellicle frame 11 having an outer peripheral dimension of 1526 mm×1748 mm and an inner peripheral dimension of 1493 mm×1711 mm and a thickness of 6.2 mm was obtained. The four outer corners of the pellicle frame were rounded to R6 mm and also the four inner corners were rounded to R2 mm. Then, the outer walls of the longer frame bars were made with pit holes 13, two on each longer bar, for facilitating handling, which were 2.5 mm in diameter and 2 mm in depth and at a distance of 1700 mm from each other on each longer bar, and each of the outer walls of the shorter frame bars was made with a groove 14, which was 2 mm in width and 3 mm in depth and had a semicircular cross section at its bottom, as shown in FIG. 4. Also, eight vent holes 12 each were made through each of the longer frame bars in the vicinity of the middle of the bars.

Next, this pellicle frame was washed well with a surface active agent and pure water, and heated and dried at a temperature of 80 degrees centigrade for three hours, and then the surface of the pellicle frame was coated with a resin. The resin used was a fluorine-containing resin Cytop CTX109A (a product name, manufactured by Asahi Glass Co. Ltd.); this was dissolved in a fluorine-based solvent EF-L102 (a product name, manufactured by Mitsubishi Materials Corporation); to this a carbon black HCF2650 (a product name, manufactured by Mitsubishi Chemical Corporation) was dispersed; then, the resulting solution was put to the pellicle frame surface by three applications of spraying. Thereafter, the pellicle frame was heated and completely dried of the solvent in an oven. The thickness of the resin coat formed was about 20 micrometers. The spray condition was controlled such that the resulting glossiness would be 3 or lower as measured by gloss meter.

In the end, the frame was measured to make sure that the size was as predetermined. Then, the frame was held horizontally by being supported at its four pit holes by pins, which had a diameter similar to the pit holes and were horizontally inserted into the respective pit holes, and the downward bow of the longer frame bars at their middle parts was measured and found to be only about 1 mm.

This pellicle frame 11 was transported into a clean room, and was washed with surface active agent and pure water, and dried; then the surface was inspected while the frame was irradiated with 400,000-lux halogen lamp in a dark room. It was found that nowhere was the carbon fiber composite exposed from the surface. Also the surface defects such as reflective spot and uneven coating were not observed, nor was there peeling of the resin coating caused by washing.

Next, using this pellicle frame a pellicle as shown in FIG. 6 was fabricated. In particular, a silicone adhesive KR3700 (a product name, manufactured by Shin-Etsu Chemical Co., Ltd.) was applied by means of an air-pressure dispenser onto the upper annular face of the pellicle frame to thereby form a pellicle membrane-bonding adhesive layer 62; and the same silicone adhesive KR3700 was applied by means of the air-pressure disperser onto the lower annular face to thereby form a mask-bonding agglutinant layer 64, and the pellicle frame was heated and cured. Next, a sheet of PET film, of which one side was coated with a releasable agent, was die-cut into a shape substantially identical to the lower annular face of the pellicle frame, and was attached to the mask-bonding agglutinant layer 65 for protection thereof; then a filter patch 67 made of PTFE was adhered to cover up each vent hole 66.

Apart from the above-described pellicle frame, a fluorine-containing polymer solution CYTOP (a product name, manufactured by Asahi Glass Co. Ltd.) was applied to a flat surface of a rectangular quartz plate measuring 1620 mm×1780 mm×17 mm (thickness) by means of spin coating; then, the solvent of the polymer solution was let evaporate, whereby a membrane having a thickness of about 4 micrometers was formed. Next, an adhesive was applied to an annular face of a rectangular temporary frame of an aluminum alloy having a similar shape as, but a smaller size than, the rectangular quartz plate on which the membrane had been formed; then the temporary frame was bonded, by its adhesive-applied face, on the membrane formed over the quartz plate. After this bonding operation, the temporary frame was removed from the quartz plate, and thus the membrane was transferred to the temporary frame. This membrane carried by the temporary frame was then brought to contact with and, thereby, permanently combine with the upper annular face of the above-described pellicle frame on which the pellicle membrane-bonding adhesive layer 62 had been applied; then by cutting off the surplus portions of the membrane, which were extending beyond the outer edges of the pellicle frame, with a cutter, a pellicle 70 was completed.

This pellicle 70 was placed on a precision surface plate, and the amount of bow with respect to each frame bar was measured and the longer bars were found to have bowed inwardly by 0.5 mm each at their respective middle parts and the shorter bars by 0.3 mm each at their respective middle parts.

Example 2

By using, as in Example 1, the same carbon fiber composite as the mother material and going through a similar procedure, a pellicle frame was made, which had an outer peripheral dimension of 122 mm×149 mm and an inner peripheral dimension of 118 mm×145 mm and a thickness of 3.0 mm, and which had its four outer corners rounded to R6 mm and its four inner corners rounded to R4 mm; and this frame was coated with a resin layer by electro deposition of an acrylic resin called ELECOAT ST SATINER (a product name, manufactured by SHIMIZU CO., LTD). The acrylic resin layer thus formed had a thickness of about 30 micrometers.

This pellicle frame was washed with the same surface active agent and pure water, and dried, and thereafter, as in Example 1, the same pellicle membrane-bonding adhesive and the same photomask-bonding agglutinant were applied in the similar manner, and the pellicle frame was heated and completely cured, whereafter the photomask-bonding agglutinant layer was overlaid with the same PET film liner. This pellicle frame was then subjected to the similar inspection, as in Example 1, in the dark room for its appearance, and it was found that the carbon fiber was completely contained underneath the resin layer and nowhere was the burr or resin peeling observed.

Apart from this pellicle frame, the fluorine-containing polymer solution CYTOP (a product name, manufactured by Asahi Glass Co. Ltd.) was applied to a face of a silicon wafer of a diameter 300 mm by spin coating; then, the solvent of the polymer solution was let evaporate to thereby obtain a membrane. Next, a temporary frame of an aluminum alloy having a similar shape as, but a smaller size than, the silicon wafer was bonded onto the membrane formed over the silicon wafer via an adhesive. After this bonding, the temporary frame was removed from the silicon wafer, and thus the membrane was transferred to the temporary frame and it had a thickness of about 0.28 micrometer. This membrane carried by the temporary frame was then brought to adhere to the pellicle membrane-bonding adhesive layer of the above-described pellicle frame; then by cutting off the surplus portions of the membrane, which were extending beyond the outer edges of the pellicle frame, with a cutter, a pellicle was completed.

In the similar manner as in Example 1, the amount of bow with respect to each frame bar of this pellicle frame was measured and the longer bars were found to have bowed inwardly by 0.05 mm each at their respective middle parts and the shorter bars by 0.02 mm each at their respective middle parts.

Example 3

By using, as in Example 1, the same carbon fiber composite as the mother material and going through a similar machining procedure, a rectangular pellicle frame was made, which had an outer peripheral dimension of 1526 mm×1748 mm and an inner peripheral dimension of 1498 mm×1720 mm and a thickness of 6.2 mm, and which had its four outer corners rounded to R6 mm and its four inner corners rounded to R2 mm. Then, four pit holes for facilitating handling were made in the outer walls of the longer frame bars, two on each longer bar, which were 2.5 mm in diameter and two of which on each bar were at a distance of 1700 mm from each other, and each of the outer walls of the shorter frame bars was made with a groove, which was 2 mm in width and 3 mm in depth. Also, eight vent holes each were made through each of the longer frame bars in the vicinity of the middle of the bars. In fact, the pellicle frame of this example differed from that of Example 1 only in the inner peripheral dimension along the longer and shorter bars. The widths of the longer and the shorter frame bars in the case of Example 3 were 16.5 mm and 18.5 mm, respectively, whereas in the case of Example 1, they were both 14 mm, and thus the width of the longer frame bars in the case of this example were 2.5 mm smaller than those in the case of Example 1 and the width of the shorter frame bars in the case of this example were 4.5 mm smaller than those in the case of Example 1.

This pellicle frame was coated with a resin layer through the similar procedure as used in Example 1: the resin solution was prepared by dissolving a silicone resin called Silicone Varnish KR-2 (a product name, manufactured by Shin-Etsu Chemical Co., Ltd.) in a toluene and then the carbon black HCF2650 (a product name, manufactured by Mitsubishi Chemical Corporation) was dispersed in it. Thereafter, the pellicle frame coated with this solution was heated at 130 degrees centigrade for half an hour in an oven to thereby completely cure the silicone resin. The thickness of the resultant silicone resin layer formed on the pellicle frame was about 30 micrometers. To this pellicle frame were then applied, like in Example 1, an agglutinant and its protective PET film liner and an adhesive and finally the pellicle membrane to complete the pellicle.

Like in Example 1, this pellicle was irradiated with the light-concentrating halogen lamp in the dark room to inspect its appearance. It was found that no carbon fiber showed in the surface of the frame, nor was any burr or resin peeling observed throughout the entire surface, which was clean.

In the similar manner as in Example 1, the amount of bow with respect to each frame bar of this pellicle frame was measured and the longer bars were found to have bowed inwardly only by 1 mm each at their respective middle parts and the shorter bars only by 0.8 mm each at their respective middle parts, in spite of reduced breadths of the frame bars, so that it was found that it is possible to gain in the light exposure area of the photomask by narrowing the breadth of the pellicle frame bars of the present invention.

In a similar manner as in Example 1, the pellicle was held horizontally, that is, by inserting into the pit holes (13), which were 2.5 mm in diameter and formed at intervals of 1700 mm along the longer bars of the frame, corresponding pins each having a similar diameter as the pit holes, and the downward bow of the longer frame bars at the middle parts was measured and found to be only about 1 mm, which is the same as in the case of Example 1.

The handling operation of the frame during the manufacturing process was conducted, as in the case of Example 1, making use of the same pit holes, and, as a result, it was found that no substantial bow or deformation of the frame bars took place that could pose a practical problem, and the handling went smoothly and safely.

Comparative Example 1

Starting with the same carbon fiber composite as used in Example 1, a pellicle frame having the same size and shape as the one made in Example 1 was made by machining. This pellicle frame was brought into the clean room, where it was subjected to the washing with the surface active agent followed by the pure water, and heated and dried, all under the same conditions as in Example 1; then the surface was inspected while the frame was irradiated with 400,000-lux halogen lamp in the dark room. It was observed that horizontal streaks showed clearly, especially in the inner frame walls and the outer frame walls, representing the laminated prepreg layers (i.e., the carbon fiber sheets), and hence the appearance was bad and, what is worse, burrs of fine carbon fiber were seen to protrude from the surface. As the result, when an observer grasped the frame with a hand wearing a white glove with some increased pressure, the glove was stained with some black-colored dust, which was thought to be debris of the carbon fiber. From these results, the pellicle frame failed to pass as an acceptable one.

Comparative Example 2

Using a rolled plate of an aluminum alloy A5052, a pellicle frame having the same size and same shape as the one made in Example 1 was made by machining; the surface of the frame was then subjected to a sand blasting and a black almite anodization in this order. The pellicle frame was washed and dried, and the silicone adhesive KR3700 (a product name, manufactured by Shin-Etsu Chemical Co., Ltd.) was applied to the upper annular face of the pellicle frame to thereby form the pellicle membrane-bonding adhesive layer, and the same silicone adhesive KR3700 was applied to the lower annular face to thereby form the mask-bonding agglutinant layer, and the pellicle frame was heated and cured. After this, exactly the same procedures as in Example 1 were taken to obtain a completed pellicle.

This pellicle, of which the frame was made of the aluminum alloy, was subjected to bow measurement with respect to the longer and shorter frame bars in the same procedure as in Example 1, and it was found that the longer bars had bowed inwardly by 3 mm each at their respective middle parts and the shorter bars by 2 mm each at their respective middle parts, which were far greater than the result in Example 1.

This pellicle frame was handled, in the similar manner as in Example 1, that is, the pellicle was held horizontally at its four pit holes, two on each longer bar, which were 2.5 mm in diameter and 2 mm in depth and two of which on each bar were at a distance of 1700 mm from each other; and it was found that during its transportation the frame bars bowed downward and swung up and down (in the direction of pellicle frame thickness) so much that it took a special care to complete a safe transportation. On this occasion, the measurement showed that the longer bars bowed or sagged downward in the middle parts by about 8 mm. Then, the pellicle was brought onto the precision surface plate for the inspection of flatness, and it was observed that the four corners of the frame, in the vicinity of which the pellicle was supported, permanently bowed upward (warp or plastic deformation) by 0.6 mm to 0.8 mm.

Comparative Example 3

Using a rolled plate of an aluminum alloy A7075T6, a pellicle frame having the same size and same shape as the one made in Example 2 was made by machining; the surface of the frame was then subjected to a sand blasting and a black almite anodization in this order. After taking the same steps as in Example 2, the pellicle frame was made into a finished pellicle complete with the pellicle membrane-bonding adhesive layer, the mask-bonding agglutinant layer and the pellicle membrane.

This pellicle, of which the frame was made of the aluminum alloy, was subjected to bow measurement with respect to the longer and shorter frame bars in the same procedure as in Example 1, and it was found that the longer bars had bowed inwardly by 0.5 mm each at their respective middle parts and the shorter bars by 0.3 mm each at their respective middle parts, which were far greater than the result in Example 2.

REFERENCE NUMERALS AND THE NAMES OF CORRESPONDING ITEMS

11: pellicle frame
12: vent hole
13: pit hole
14: groove
15: step
16: carbon fiber sheet
17: resin coat
61: pellicle frame
62: pellicle membrane-bonding adhesive layer
63: pellicle membrane
64: photomask-bonding agglutinant layer
65: releasable layer (separator)
66: vent hole
67: filter
68: pit hole
69: groove
70: pellicle

What is claimed is:

1. A pellicle frame comprising (i) an inner composite body consisting of carbon fiber and a resin and (ii) a clad body consisting of a resin, said clad body entirely enclosing said inner composite body.

2. A pellicle frame as claimed in claim 1 wherein said inner composite body consists of a carbon fiber sheet lamination and a resin with which said lamination is impregnated.

3. A pellicle frame as claimed in claim 2 wherein said clad body is made of a fluorine-containing resin.

4. A pellicle frame as claimed in claim 2 wherein said clad body is made of a silicone resin.

5. A pellicle frame as claimed in claim 2 wherein said clad body is made of an acrylic resin.

6. A pellicle frame as claimed in claim 2 wherein the said clad body is black in color.

7. A pellicle having a frame as claimed in claim 2.

* * * * *